(12) United States Patent
Ericson et al.

(10) Patent No.: US 8,681,945 B2
(45) Date of Patent: Mar. 25, 2014

(54) CALIBRATION OF A LINE DRIVING DEVICE

(75) Inventors: Klas Ericson, Alvsjo (SE); Antoni Fertner, Stockholm (SE); Fredrik Lindqvist, Jarfalla (SE); Henrik Almeida, Hagersten (SE); Miguel Berg, Upplands Vasby (SE); Per Ola Borjesson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 13/334,602

(22) Filed: Dec. 22, 2011

(65) Prior Publication Data

US 2013/0163729 A1 Jun. 27, 2013

(51) Int. Cl.
*H04M 1/24* (2006.01)
*H04M 3/08* (2006.01)
*H04M 3/22* (2006.01)
*H04M 1/00* (2006.01)

(52) U.S. Cl.
USPC .................. 379/3; 379/1.03; 379/394

(58) Field of Classification Search
USPC ...................... 379/3, 394, 398, 403
See application file for complete search history.

(56) References Cited

U.S. PATENT DOCUMENTS

| | | | |
|---|---|---|---|
| 7,085,372 B1 * | 8/2006 | Heise | 379/399.01 |
| 2003/0231023 A1 | 12/2003 | Belge et al. | |
| 2006/0251160 A1 * | 11/2006 | Fazlollahi et al. | 375/222 |
| 2006/0251221 A1 | 11/2006 | Rosenberg | |
| 2009/0268646 A1 * | 10/2009 | Kwan et al. | 370/286 |

\* cited by examiner

*Primary Examiner* — Quoc D Tran

(57) ABSTRACT

Method, arrangement and devices for calibration of a line driving device, such as a DSLAM, having a line port. The method comprises deriving of a first parameter vector, PVinf, for example Hinf. The parameter vector PVinf is derived by performing, at a first site, an echo measurement on the line driving device while the line port on said line driving device is open. The method further comprises calibrating the line driving device based on the first parameter vector PVinf and a second parameter vector PVref, which second parameter vector is based on information on echo measurements performed on at least one reference line driving device.

20 Claims, 6 Drawing Sheets

CALIBRATION OF A LINE DRIVING DEVICE

TECHNICAL FIELD

The invention relates generally to the calibration of a line driving device or transceiver unit, such as a Digital Subscriber Line Access Multiplexer (DSLAM), and particularly to deriving of calibration parameters.

BACKGROUND

A DSLAM typically has multiple line ports, where each such port includes a transceiver and can be connected to a subscriber line (also known as a loop). Apart from Digital Subscriber Line (DSL) communication, a DSLAM can be used for testing the quality of the lines it is applied to, typically twisted copper pairs. Such testing can be done using Single Ended Line Test (SELT). A test signal can be sent to the line(s) to be tested, and corresponding echo(es) be received. The echoes are then further analyzed to estimate the length of the total line, interfaces between line sections of different diameter, etc. To get proper measurement values, the DSLAM including its analogue front end (AFE) must be calibrated. Performing a conventional full calibration of a DSLAM takes considerable time. At least two test impedances have to be applied to each port of the DSLAM and at least three echo measurements have to be performed for each port. To get a more accurate calibration, three or more test impedances are needed. This procedure is time consuming and demands handling of every single DSLAM port.

Typically, calibration parameters are derived at "a factory", e.g. in connection with manufacturing of DSLAMs where a single set of calibration parameters are used for a whole batch of DSLAMs, since it is assumed that component variations etc are small. For best performance, full (individual) calibration should be performed on each port of each DSLAM. Such individual calibration parameters could theoretically be obtained during production or in conjunction with deployment (central office, cabinet, etc) where the latter has the advantage that the calibration would better correspond to the usual working environment of the DSLAMs, as actual temperature, humidity, etc. However, full individual port calibration is not feasible in practice since it is time consuming and would either substantially increase costs or reduce deployment rate. Further, when installing equipment for hundreds or thousands of subscribers, an additional time-consuming calibration step quickly adds up to unacceptable levels of service interruption.

Thus, there is a need for a calibration solution that neither demands a lot of manual handling nor is time consuming during production and/or at the installation site.

SUMMARY

It would be desirable to calibrate e.g. DSLAMs at the installation site within the short time available for this purpose. It is an object of the invention to provide a solution which enables such a calibration.

An exemplifying embodiment of the herein suggested solution could be described or summarized as a two step method:

Step One: Full Calibration of a Batch of DSLAMs Based on Batch Prototype

At the factory, a full calibration of DSLAM ports may be performed, using a single set of calibration parameters for all DSLAMs in the batch.

1. First, perform echo measurements on known impedances connected to one or more ports of one or more reference/batch prototype DSLAMs to derive calibration statistics from said DSLAM(s).
2. Calculate needed calibration parameters, and further calculate some statistical properties from the derived statistics.
3. Provide all DSLAMs of the batch that are to be installed with equal values of the calibration parameters/constants.

Step Two: Individual Port Calibration of DSLAMs at Installation and/or at Production During the installation process in e.g. a central office or a cabinet when the DSLAMs are to be connected to subscriber lines, the calibration of the DSLAM is refined.

1. Measure an echo for each port when no load is connected (open-circuit).
   These measurements can be performed simultaneously for several DSLAMs and/or DSLAM ports.
2. Use these measurements for refining all the calibration parameters on each port of the DSLAMs to be installed. This is possible by using existing dependence, either deterministic or statistical, between the calibration parameters. All the DSLAM ports have now got an individual set of calibration parameters.

The use of the herein described method and arrangements may entail the following advantages:

Less Manual Handling:

The advantage of the proposed calibration is that it demands less manual handling than a conventional calibration process. No test impedances need to be attached during the individual port calibration.

Less Time Consuming:

Also it is less time consuming. Just one echo measurement is needed to give all DSLAM ports an individual calibration, and thousands of ports can be measured simultaneously.

Relevant Ambient Circumstances:

As the calibration can be made quickly, it can be performed at the site where the DSLAMs are to be connected to the subscribers just before they are attached. Thus the equipment can be calibrated at a relevant, temperature, humidity etc.

According to a first aspect, a method is provided for calibration of a line driving device, such as a DSLAM, having a line port ((i.e. a port where subscriber line can be connected, sometimes called line input). The method comprises deriving of a first parameter vector, PVinf, for example Hinf. The parameter vector PVinf is derived by performing, at a first site, an echo measurement on the line driving device while the port on said line driving device is open. The method further comprises calibrating the line driving device based on the first parameter vector PVinf and a second parameter vector PVref, which second parameter vector is based on information on echo measurements performed on at least one reference line driving device.

According to a second aspect, an arrangement is provided, in a communication system, for calibration of a line driving device having a line port. The arrangement comprises a deriving unit, which is adapted to derive a first parameter vector PVinf by performing an echo measurement on the line driving device while the port on said line driving device is open. The arrangement further comprises a calibration unit, which is adapted to calibrate the line driving device based on the first parameter vector PVinf and a second parameter vector PVref, which second parameter vector is based on information on echo measurements performed on at least one reference line driving device.

According to a third aspect, a line driving device is provided, which comprises an arrangement according to the second aspect.

According to a fourth aspect, a DSLAM is provided, which comprises an arrangement according to the second aspect.

According to a fifth aspect, a computer program is provided, which when run in an arrangement or node according to any of the second, third or fourth aspect causes the arrangement or node to perform the corresponding method according to the first aspect.

According to a sixth aspect, a computer program product is provided, which comprises a computer program according to the fifth aspect.

The above method, arrangement, device; DSLAM; computer program and/or computer program product may be used for calibration of a/the line driving device in an advantageous way, which will be further described below.

Further, the above method, arrangement, device; DSLAM; computer program and/or computer program product may be implemented in different embodiments. The parameter vector PVref could be set to e.g. a reference value derived from one or more reference devices. Further, the parameter vector PVref may be refined by estimating said parameter vector further based on the first parameter vector PVinf. The information may relate to one or more of e.g.: a parameter vector representing echo characteristics of a reference line driving device having the line port connected to a known load; a mean value of parameter vectors representing echo characteristics of a set of reference line driving devices having the line port connected to a known load; a mean value of parameter vectors representing echo characteristics of a set of reference line driving devices having an open line port; and a relation between echo characteristics of a set of reference line driving devices having an open line port, and echo characteristics of the set of reference line driving devices having the line port connected to a known load.

The known load may be a short circuit or a reference impedance Zref. The information may be obtained from a control node in a communication system in which the line driving device is to operate. Further, the first site may be a site where the line driving device is to be located during operation in a communication system. The method may be performed e.g. during device installation and/or during manufacturing. No additional components should be needed for performing the method, than the components, which are to be used during operation. Further, the second parameter vector PVref may be based on information on measurements which are performed at a second site, which is different from the first site.

The embodiments above have mainly been described in terms of a method. However, the description above is also intended to embrace embodiments of the arrangement, device, DSLAM, computer program and computer program product configured to enable the performance of the above described features. The different features of the exemplary embodiments above may be combined in different ways according to need, requirements or preference.

BRIEF DESCRIPTION OF THE DRAWINGS

The foregoing and other objects, features, and advantages of the technology disclosed herein will be apparent from the following more particular description of preferred embodiments as illustrated in the accompanying drawings. The drawings are not necessarily to scale, emphasis instead being placed upon illustrating the principles of the technology disclosed herein.

DETAILED DESCRIPTION

Figure 1:
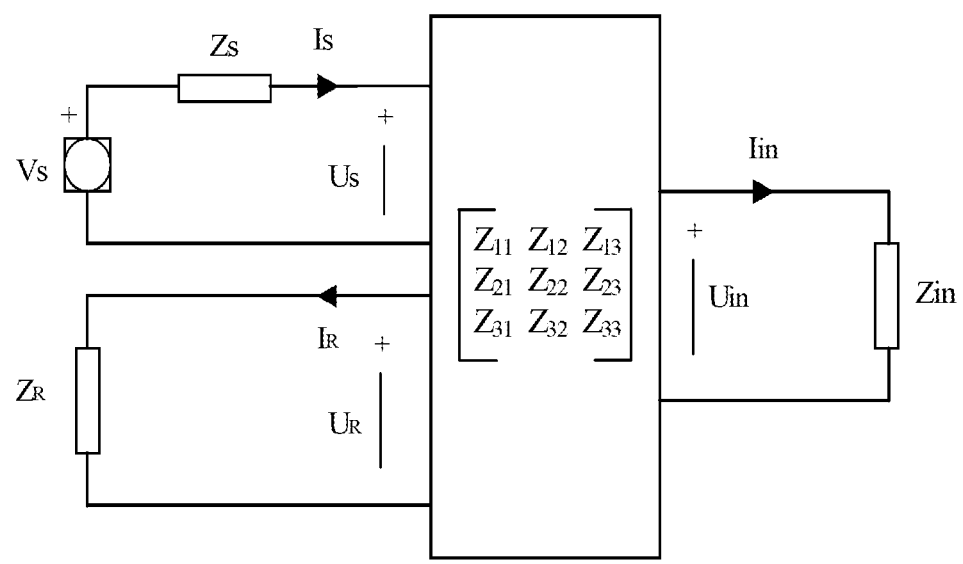
FIG. 1 is a schematic view illustrating a generic three-port network

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, e.g., any elements developed that perform the same function, regardless of structure.

Thus, for example, it will be appreciated by those skilled in the art that block diagrams herein can represent conceptual views of illustrative circuitry or other functional units embodying the principles of the technology. Similarly, it will be appreciated that any flow charts, state transition diagrams, pseudo code, and the like represent various processes which may be substantially represented in computer readable medium and so executed by a computer or processor, whether or not such computer or processor is explicitly shown.

The functions of the various elements including functional blocks, including but not limited to those labeled or described as "computer", "processor" or "controller", may be provided through the use of hardware such as circuit hardware and/or hardware capable of executing software in the form of coded instructions stored on computer readable medium. Thus, such functions and illustrated functional blocks are to be understood as being either hardware-implemented and/or computer-implemented, and thus machine-implemented.

In terms of hardware implementation, the functional blocks may include or encompass, without limitation, digital signal processor (DSP) hardware, reduced instruction set processor, hardware (e.g., digital or analog) circuitry including but not limited to application specific integrated circuit(s) (ASIC), and (where appropriate) state machines capable of performing such functions.

Herein, a certain set of parameters will be referred to, which are commonly used in the art. However, other sets of parameters could be used, such as the elements of an impedance matrix, also known as a Z-matrix, or the elements of a scattering matrix, which reflect the same characteristics, but expressed in another way. Such other parameter sets are considered to be implicitly covered by this disclosure.

The exemplifying parameters which will be discussed herein are:

Hinf or $H_\infty$, which is the echo transfer function i.e., the quotient between the received and the sent signal of one DSLAM line port when it is open (which corresponds to infinite impedance);

H0 or $H_0$, which is the echo transfer function, i.e., the quotient between the received and the sent signal of one DSLAM line port when it is short circuited or "shorted", which corresponds to approximately no (zero) impedance; and Zhyb or $Z_{hyb}$ is a hybrid impedance, which will be further described below.

Since it is very time consuming to obtain the calibration parameters, such parameters are typically derived at a factory. Further, in order to save time and money, calibration parameters are typically derived only from a small set of reference DSLAMs, or even a single one. The calibration parameters derived from this small set are then applied e.g. to all DSLAMs of the same type.

Derivation of a Parameterized Expression of the Echo Transfer Function

Considering a single DSLAM port, the Analogue Front End (AFE) of a DSLAM can be modeled as a so-called "three port", where the ports are the sending ($U_S$), receiving ($U_R$) and line port ($U_{in}$) of the AFE. A generic three-port network is shown in FIG. 1. The relationship between voltage and current is given by impedance parameters as:

$$\begin{bmatrix} U_S \\ U_R \\ U_{in} \end{bmatrix} = \begin{bmatrix} z_{11} & z_{12} & z_{13} \\ z_{21} & z_{22} & z_{23} \\ z_{31} & z_{32} & z_{33} \end{bmatrix} \cdot \begin{bmatrix} I_S \\ I_R \\ I_{in} \end{bmatrix} \quad (1)$$

The variables in equation (1) are assumed to be frequency dependent, i.e. $U_s \equiv U_s(f)$ and $z_{11} \equiv z_{11}(f)$. However, for simplicity, the frequency dependence will not be explicitly denoted in the present document.

Manipulating the equation (1), the following expression can be obtained:

$$H_{echo} = \frac{H_\infty Z_{in} + Z_{h0}}{Z_{hyb} + Z_{in}}, \quad (2)$$

where $H_\infty$, $Z_{h0}$ and $Z_{hyb}$ are functions of the elements of the system matrix in equation. (1).

Letting $Z_{in} \to \infty$, i.e., no load connected to port 3, equation (2) results in $$H_{echo}|_{Z_{in}=\infty} = H_\infty, \quad (3)$$

i.e., the echo transfer function with open-circuit line input (or port).

Letting $Z_{in} \to 0$, i.e., short circuit port 3, equation (7) results in $$H_{echo}|_{Z_{in}=0} = \frac{Z_{h0}}{Z_{hyb}} \equiv H_0, \quad (4)$$

i.e., the echo transfer function with short circuited or shorted line input.

Using the definition (4), it can be seen that expression (2) describes the echo transfer function with three parameters $H_\infty$, $H_0$ and $Z_{hyb}$. The parameters $H_\infty$ and $H_0$ are the echo transfer function with the line input open and shorted, respectively.

Further manipulation with equation (1) and (2) yield a relation between these parameters:

$$H_0 = H_\infty \cdot \frac{1}{Z_{hyb}} \cdot \frac{z_{23}z_{31} - z_{21}z_{33}}{z_{21}}. \quad (5)$$

It can also be shown that:

$$Z_{hyb} = g(Z_R, Z_S, z_{11}, z_{12}, \ldots z_{33}) + z_{33} \xrightarrow{z_{12}, z_{21} \to \infty} z_{33}, \quad (6)$$

where g is some function.

This indicates that the parameter $Z_{hyb}$ is equal to the output impedance of port 3 when the isolation between the sending (port 1) and receiving (port 2) port is high or the bridge of the AFE is in balance.

Estimation of the Echo Transfer Function Parameters

Equation (2) can be rewritten as:

$$H_0 Z_{h0} - H_\infty Z_{in} + H_{echo} Z_{hyb} = H_{echo} Z_{in}, \quad (7)$$

or equivalently:

$$\begin{bmatrix} 1 & -H_{echo} & Z_{in} \end{bmatrix} \cdot \begin{bmatrix} Z_{h0} \\ Z_{hyb} \\ H_\infty \end{bmatrix} = H_{echo} Z_{in}. \quad (8)$$

Obviously, $H_\infty$, $Z_{h0}$ and $Z_{hyb}$ can be estimated from a series of measurements for different $Z_{in}$. However, $H_\infty$ may alternatively be anticipated from the single measurement corresponding to $Z_{in} \to \infty$.

It reduces further estimation to:

$$\begin{bmatrix} 1 & -H_{echo} \end{bmatrix} \cdot \begin{bmatrix} Z_{h0} \\ Z_{hyb} \end{bmatrix} = \begin{pmatrix} H_{echo} & -H_\infty \end{pmatrix} \cdot Z_{in} \quad (9)$$

Furthermore, by also achieving $H_0$ by direct measurement, only $Z_{hyb}$ has to be estimated. It was stated in the definition (4), that $H_0 = Z_{h0}/Z_{hyb}$. Thus, solving for $Z_{hyb}$ in equation (6), it is obtained:

$$Z_{hyb} = Z_{in} \frac{H_{echo} - H_\infty}{H_0 - H_{echo}} \quad (10)$$

Thus, the values of $H_\infty$, $H_0$ and $Z_{hyb}$ can be estimated during the manufacturing process using equations (8), (9) or (10) depending on whether $H_\infty$ or $H_0$ or none of them are known (measured) or not.

Estimation of the Line Input Impedance

Rewriting equation (10) to allow estimation of the actual input impedance of the transmission line with $$Z_{in} = Z_{hyb} \frac{H_0 - H_{echo}}{H_{echo} - H_\infty}, \quad (11)$$

where $H_{echo}$ is the measured transfer function of the echo path.

Consequently, the parameters Hinf, H0 and Zhyb may be used for calibration of the IPSLAM. As previously described, these parameters (or corresponding parameters) have conventionally been derived for one or more reference devices and then been used for calibrating devices of the same type as the reference device(s), based on the assumption that the devices are equal enough. None of these parameters have been considered to be more important than the others.

Now, however, the inventors have studied the properties of these parameters, and made certain observations of importance, which will be described below.

Sensitivity of the Estimation of the Loop Impedance Due to Errors in the Model Parameters The sensitivity of the estimated input impedance, $Z_{in}$, due to the parameters $H_\infty$, $H_0$ and $Z_{hyb}$ will now be examined. A first order approximation of the error can be expressed as follows:

$$\Delta Z_{in} = \frac{\partial Z_{in}}{\partial H_\infty} \Delta H_\infty + \frac{\partial Z_{in}}{\partial H_0} \Delta H_0 + \frac{\partial Z_{in}}{\partial Z_{hyb}} \Delta Z_{hyb}. \quad (12)$$

As $Z_{in}$ is complex variable, the derivation of $Z_{in}$ must be carried out along both the real and imaginary axis. The partial derivatives are obtained as $$\frac{\partial Z_{in}}{\partial H_\infty} = Z_{hyb} \frac{(H_0 - H_{echo})}{(H_{echo} - H_\infty)^2} \quad (13)$$

$$\frac{\partial Z_{in}}{\partial H_0} = \frac{Z_{hyb}}{H_{echo} - H_\infty} \quad (14)$$

and $$\frac{\partial Z_{in}}{\partial Z_{hyb}} = \frac{H_0 - H_{echo}}{H_{echo} - H_\infty} \quad (15)$$

By associating equation (12) with the equations (13)-(15), the sensitivity of $Z_{in}$ with respect of $H_\infty$, $H_0$ and $Z_{hyb}$ can be studied.

It should be noted that the sensitivity for all the parameters increases with increasing load impedance because of the term $H_{echo}-H_\infty$ in the denominators. This in turn, indicates that the error will be larger for low frequencies than for high frequencies as the (input) impedance of a twisted copper pair is high for low frequencies but decays exponentially with frequency down to a constant value.

Also, it should be noted that the term $H_{echo}-H_\infty$ occurs squared in the denominator of (13). This means that $H_\infty$ will be the most sensitive parameter for $Z_{in}$ at low frequencies.

For low impedances at the line output, as for the input impedance of a twisted pair at high frequencies, the term $(H_0-H_{echo})$ in nominator of (13) and (15) will be small, resulting in a low sensitivity.

The Relative Sensitivity of the Estimated Input Impedance

The relative sensitivity of $Z_{in}$ with respect to the relative changes of $H_\infty$, $H_0$ and $Z_{hyb}$ can be found using equation (11) in equations (13), (14) and (15), respectively. A relative error due to $H_\infty$ solely, is drawn from equations (12), (11) and (13) as follows:

$$\left(\frac{\Delta Z_{in}}{Z_{in}}\right)_{\Delta H_\infty} = \frac{\partial Z_{in}}{\partial H_\infty} \Delta H_\infty \cdot \frac{1}{Z_{in}} = Z_{hyb} \frac{(H_0 - H_{echo})}{(H_{echo} - H_\infty)^2} \frac{\Delta H_\infty}{Z_{in}} \quad (16)$$

$$= \frac{\Delta H_\infty}{H_\infty} \frac{1}{\left(\frac{H_{echo}}{H_\infty} - 1\right)}$$

Similarly we obtain $$\left(\frac{\Delta Z_{in}}{Z_{in}}\right)_{\Delta H_0} = \frac{\Delta H_0}{H_0} \frac{1}{\left(1 - \frac{H_{echo}}{H_0}\right)} \quad (17)$$

and $$\left(\frac{\Delta Z_{in}}{Z_{in}}\right)_{\Delta Z_{hyb}} = \frac{\Delta Z_{hyb}}{Z_{hyb}} \quad (18)$$

From equation (18) it can be seen that the relative error of the estimated impedance, $$\frac{\Delta Z_{in}}{Z_{in}},$$

will be directly proportional to the relative error of the $Z_{hyb}$ estimation.

The dependences of the relative errors of $H_0$ and $H_\infty$ are, however, more complicated. From expression (16) we can see that the denominator of the right part of the equality will go towards zero when large impedances are applied to the line output of the DSLAM. This means that the error of the parameter estimation will be multiplied with a factor larger than one, thus magnifying the error.

From expression (17) we can see an analogue dependence between the relative error of the estimation of $H_0$ and the relative error of the estimated impedance. Here, the error will increase with decreasing load impedance. Also, this relation will be frequency dependent.

Note, however, that neither of the terms is squared as in (13). Thus, the relative sensitivity of $Z_{in}$ will be similar for the relative change of $H_0$ and $H_\infty$.

Sensitivity of the Estimation of the Loop Impedance Due to Errors in the Echo Measurements Up to now, we have only taken the accuracy of the model parameters into consideration when analyzing the accuracy of the input impedance. Equation (11) indicates that the accuracy of the estimation of the input impedance is strongly dependent of the corresponding echo measurements. We can suspect problems with cancellation for large values and, especially, low values of impedances.

We proceed analogous to the preceding section. Differentiating the right part of equation (11) results in:

$$(\Delta Z_{in})_{\Delta H_{echo}} = \frac{\partial Z_{in}}{\partial H_{echo}} \Delta H_{echo} = Z_{hyb} \frac{(H_0 - H_\infty)}{(H_{echo} - H_\infty)^2} \Delta H_{echo}, \quad (19a)$$

or $$(\Delta Z_{in})_{\Delta H_{echo}} = Z_{in} \frac{(H_0 - H_\infty)}{(H_{echo} - H_\infty)(H_0 - H_{echo})} \Delta H_{echo}. \quad (19b)$$

The relative error of the input impedance is obtained by identification using equation (11) again. This result in $$\left(\frac{\Delta Z_{in}}{Z_{in}}\right)_{\Delta H_{echo}} = \frac{(H_0 - H_\infty)}{(H_{echo} - H_\infty)(H_0 - H_{echo})} \Delta H_{echo}. \quad (20)$$

From equation (19b) it can be seen that the relative error of the estimation of the input impedance will be emphasized for large input impedances. Further, a dependence of the parameter $Z_{hyb}$ can be seen. From equation (19b) it can be seen that the relative "magnitude" of the estimation of the error of the input impedance will be less dependent of the measurement error. However, for large values or small values of impedance the sensitivity will raise, but not in quadratic manner.

Calibration

Study the expression for the estimation of the input impedance again:

$$Z_{in} = Z_{hyb} \frac{H_0 - H_{echo}}{H_{echo} - H_\infty}. \quad (11)$$

To be able to make proper impedance estimations from echo measurements, the values of the parameters $H_\infty$, $H_0$ and $Z_{hyb}$ need to be known with great accuracy.

In the following sections, examples will be given of how DSLAMS can be calibrated in a two step manner based on the observations made above.

Calibration Procedure

Below, a possible method for estimating the parameters $H_\infty$, $H_0$ and $Z_{hyb}$ will be described.

The expressions (8), (9) and (10) allow several ways to perform calibration. The expressions can be the base for Mean Square (MS) estimations of the calibration parameters $H_\infty$, $H_0$ and $Z_{hyb}$. Using expression (8) given the impedance of three arbitrary loads $Z_{in1}$, $Z_{in2}$ and $Z_{in3}$ together with their corresponding echoes $H_{echo1}$, $H_{echo2}$, $H_{echo3}$ result in:

$$\begin{bmatrix} Z_{hyb1} & -H_{echo1} & Z_{in1} \\ Z_{hyb2} & -H_{echo2} & Z_{in2} \\ Z_{hyb3} & -H_{echo3} & Z_{in3} \end{bmatrix} * \begin{bmatrix} H_0 \\ Z_{hyb} \\ H_\infty \end{bmatrix} = \begin{bmatrix} H_{echo1} \\ H_{echo2} \\ H_{echo3} \end{bmatrix} \cdot \begin{bmatrix} Z_{in1} \\ Z_{in2} \\ Z_{in3} \end{bmatrix}, \quad (21)$$

or $$b = A * x \quad (22)$$

where $$b = \begin{bmatrix} H_{echo1} \\ H_{echo2} \\ H_{echo3} \end{bmatrix} \cdot \begin{bmatrix} Z_{in1} \\ Z_{in2} \\ Z_{in3} \end{bmatrix}, \quad (23)$$

$$A = \begin{bmatrix} 1 & -H_{echo1} & Z_{in1} \\ 1 & -H_{echo2} & Z_{in2} \\ 1 & -H_{echo3} & Z_{in3} \end{bmatrix} \quad (24)$$

and $$x = \begin{bmatrix} H_0 \\ Z_{hyb} \\ H_\infty \end{bmatrix}. \quad (25)$$

The operators "*" and "." denote vector and scalar multiplication respectively. The expression (21) has the solution $$x = A^{-1} \cdot b. \quad (26)$$

Thus, to obtain a proper solution for the three calibration parameters $H_\infty$, $H_0$ and $Z_{hyb}$, at least three output terminal loads and corresponding echoes are needed. Note that two of the loads can e.g. be simply shorted or open output terminals.

A calibration method utilizing the realizations described above may be regarded as comprising two steps. A first step, where reference parameters are derived, and a second step, where at least one value for an individual DSLAM is derived. The two step method will be further described below.

Estimating all Parameters in a First Calibration Step

Above, it was described how the parameters $H_\infty$, $H_0$ and $Z_{hyb}$ can be estimated for two or more ports of one or more reference DSLAMs (a batch sample) during the manufacturing process:

Apply the mean value (derived from reference DSLAM(s)) of each parameter to all ports of the DSLAMs to be installed at the site. Using equation (5) and denoting these mean values $\overline{H}_\infty$, $\overline{H}_0$ and $\overline{Z}_{hyb}$, the estimation of $Z_{in}$ made with DSLAM port number k will be $$Z_{in}^k = \overline{Z}_{hyb} \frac{\overline{H}_0 - H_{echo}}{H_{echo} - \overline{H}_\infty}. \quad (27)$$

The accuracy of the $Z_{in}$ estimation will depend on how well the actual parameters $H_\infty^k$, $H_0^k$ and $Z_{hyb}^k$ resemble the mean parameters $\overline{H}_\infty$, $\overline{H}_0$ and $\overline{Z}_{hyb}$. The error has been previously discussed.

A Second Individual Estimation of Hinf in a Second Calibration Step

At a second calibration step, one or more of the calibration parameters can be estimated for each individual DSLAM port to be installed. These new individual estimates will then substitute the (mean) values obtained at the manufacturing process.

According to the previous discussion concerning the influence of errors in different parameters, it may be concluded that the accuracy of the parameter $H_\infty$ seriously influence the estimation of line input impedance. More so than errors in $H_0$ and $Z_{hyb}$. Thus, it may be concluded that it is most important to derive a refined individual estimate of $H_\infty$, as compared to the other parameters.

Thus, if possible, estimate this parameter for each line of each DSLAM, preferably at the final location of the equipment, i.e. the place where it will serve the subscribers. The estimations will then be performed in the final operation environment with proper temperature, humidity, etc.

As previously described, the calibration parameter $H_\infty$ can be estimated by just measuring an echo with no line terminals connected (open line input). See equation (3). Thus, no special preparations are required, such as e.g. applying of different loads to the line inputs. Further, the measurement can be performed simultaneously for thousands of DSLAM lines e.g. all lines of all of the DSLAMs set up to be installed at the site of future operation. Thus, the procedure of deriving a new individual estimate of $H_\infty$ requires only a minimum of measurement time and need for manual handling. Denote these refined values of the calibration parameter $H_\infty$ with $\hat{H}_\infty$. Thus, an estimation of the input impedance performed with DSLAM port n among of all the DSLAMs to be installed can be written as:

$$Z_{in}^n = \overline{Z}_{hyb} \frac{\overline{H}_0 - H_{echo}}{H_{echo} - \hat{H}_\infty} \quad (28)$$

Utilizing Relations Between the Calibration Parameters

As indicated in equation (5), the calibration parameters are related to each other. This can be utilized to improve the estimation of the calibration parameters $H_0$ and $Z_{hyb}$ using the individual calibration estimation of $H_\infty(\hat{H}_\infty)$ discussed above. Derivating $H_0$ in equation (5) with respect to $H_\infty$ results in:

$$\frac{\partial H_0}{\partial H_\infty} = \frac{1}{Z_{hyb}} \cdot \frac{z_{23}z_{31} - z_{21}z_{33}}{z_{21}} \quad (29)$$

Denote a refined estimate of $H_0$ with $\hat{H}_0$. Equation (29) can then be approximated with $$\frac{\hat{H}_0 - \overline{H}_0}{\Delta H_\infty} = \frac{1}{Z_{hyb}} \cdot \frac{z_{23}z_{31} - z_{21}z_{33}}{z_{21}}, \quad (30)$$

which can be rewritten to:

$$\hat{H}_0 = \overline{H}_0 + \frac{1}{Z_{hyb}} \cdot \frac{z_{23}z_{31} - z_{21}z_{33}}{z_{21}} \cdot \Delta H_\infty. \quad (31)$$

This expresses that a refined value of $\overline{H}_0$ can be achieved by using the correction of the parameter $\overline{H}_\infty$ in the preceding subchapter $$\Delta H_\infty = \hat{H}_\infty - \overline{H}_\infty. \quad (32)$$

A statistical Approach for Estimating the Relation Between the Calibration Parameters In the general case the relation between the calibration parameters can be described with equation (5). This expression, however, contains unknown parameters and the relation (31) can, thus perhaps not be used directly to correct $H_0$ or $Z_{hyb}$.

However, in the first calibration step, statistics from the measurements performed on a set of two or more reference DSLAM ports may be collected. These data or statistics can be used for estimating the relation between, e.g. a new estimate of $H_0$, denoted $\hat{H}_0$, and the stored mean of $H_0$, denoted $\overline{H}_0$, and an individually updated (by measurements) value of $H_\infty$, denoted $\hat{H}_\infty$, and the stored (reference) mean of $H_\infty$, denoted $\overline{H}_\infty$.

Mathematically this may be formulated as regression between the dependent variable $H_0$ and an explanatory variable $H_\infty$. Further, a linear dependency is assumed as a satisfactory approximation of the relation. That a linear dependency is probable is indicated by equation (5).

Equations may then be written as follows $$\hat{H}_0 - \overline{H}_0 = \alpha \cdot (\hat{H}_\infty - \overline{H}_\infty) + \epsilon^i \quad (33)$$

where i=1 ... N, and N is the number of measured DSLAM ports and $\alpha$ is known in the literature as the regression coefficient and finally, $\epsilon^i$ is called the error term.

Hence determining the linear regression coefficients may be reduced to solve either of two equivalent formal mathematical problems, namely
  to find a mean of the conditional probability $p(H_0|H_\infty)$ or
  to minimize sum of squares of $\epsilon^i$ In the first case, the vector $H_\infty(i)$ is assumed to have Gaussian probability density function having individual mean value and variance. In the second case Gaussian distribution is not necessary.

Without going into details, it can be shown that in both cases a subsequent relation has to be fulfilled, namely $$\frac{\hat{H}_0 - \overline{H}_0}{\sigma_{H_0}} = \frac{\text{cov}(H_0\ H_\infty)}{\sigma_{H_0} \cdot \sigma_{H_\infty}} \cdot \frac{\hat{H}_\infty - \overline{H}_\infty}{\sigma_{H_\infty}}, \quad (34)$$

and therefore the regression coefficient, $\alpha$, can be determined as $$\alpha = \frac{\text{cov}(H_0\ H_\infty)}{\sigma_{H_0} \cdot \sigma_{H_\infty}} \quad (35)$$

From (34) one may derive the procedure to obtain a corrected value of $H_0$ by $$\hat{H}_0 = \overline{H}_0 + \frac{\text{cov}(H_0\ H_\infty)}{\sigma_{H_\infty}^2} (\hat{H}_\infty - \overline{H}_\infty) \quad (36)$$

or equivalently $$\Delta H_0 = \frac{\text{cov}(H_0\ H_\infty)}{\sigma_{H_\infty}^2} \cdot \Delta H_\infty \quad (37)$$

In this case four parameters $\overline{H}_\infty$, $\overline{H}_0$, $\text{cov}(H_0\ H_\infty)$ and $\sigma_{H_\infty}$ need to be stored with data from the manufacturing process or the first calibration step.

There is, however, an alternative but less memory-effective way to describe this using the cross correlation coefficient between $H_0$ and $H_\infty$, $\rho_{H_0 H_\infty}$, and their respective standard deviations, $\sigma_{H_0}$ and $\sigma_{H_\infty}$, namely $$\Delta H_0 = \rho_{H_0\ H_\infty} \cdot \frac{\sigma_{H_0}}{\sigma_{H_\infty}} \cdot \Delta H_\infty \quad (38)$$

The use of this expression requires one more (vector) variable to be stored as compared to when using the expression (37).

Similarly a dependence between $\hat{H}_\infty$ and $Z_{hyb}$ can be developed, thus leading to an individually updated value of $Z_{hyb}$ which can be denoted $\hat{Z}_{hyb}$.

Thus, by updating an individual value of $H_\infty$ for each port of the DSLAMs to be installed in e.g. a central office or street cabinet, the other calibration parameters can be updated too, by using their statistics and statistical interrelationship.

Example of Proposed Method—Two Step Calibration

Step One: Batch Prototype/Reference DSLAM(s)

At the factory, a full calibration of DSLAM lines may be performed. At least for the statistical approach, the measurements in the first step should be performed on at least two ports of preferably at least two reference DSLAMs. However, for the simpler case, less may suffice:
  1. First, perform echo measurements on known load impedances for two or more DSLAM ports from a set of reference/batch prototype DSLAMs to derive calibration statistics (to be used for the DSLAM ports of the whole batch of DSLAMs)
2. Calculate needed calibration parameters based on the calibration statistics. Further calculate some statistical properties, such as e.g. mean, variance and correlation.
3. Load DSLAMs of the batch that are to be installed with equal values of the calibration parameters/constants (parameter vectors), e.g. their mean values. It should be noted that this information does not have to be loaded physically to the DSLAMs, but can be stored e.g. in some external management system.

Step Two: Individual Calibration at Installation

During the installation process in e.g. a central office or a cabinet, before the DSLAMs are connected to subscriber lines, calibration of the individual ports is refined by performing of:
1. Measuring e.g. an echo for each port when no load is connected (open-circuit). Thus individual echo measures of open-line echo, $H_\infty$, are obtained for each line. These measurements can be performed simultaneously for several DSLAM ports.
2. Using the estimations of $\overline{H}_0$ and $\overline{Z}_{hyb}$, obtained in the calibration process of the batch prototypes, and the estimations of the individual echoes for open-circuit DSLAM ports as estimations of $H_\infty$ for each line, thus obtaining new individual sets of calibration parameters $\hat{H}_\infty$, $\hat{H}_0$ and $\hat{Z}_{hyb}$ for each line of all DSLAMs to be installed.
3. The calibration process can be done by using the known deterministic or statistical relation between the parameters $H_\infty$, $H_0$ and $Z_{hyb}$.

Below, further exemplifying embodiments will be described with reference to figures. The description below reflects what has been described above using other words, and provides generic examples and specific different possibilities.

Figure 2:
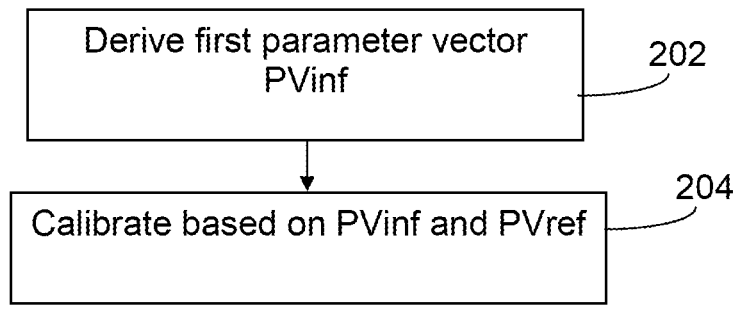
FIGS. 2-3 are flow charts illustrating actions in procedures according to different exemplifying embodiments.

Exemplifying Procedure, FIG. 2

Initially, a first parameter vector, PVinf is derived by performing an echo measurement on a line driving device, LDD or Transceiver Unit (TU), such as a DSLAM, in a first action 202. The parameter vector PVinf may be identical to Hinf, described above. However, PVinf is also considered to embrace alternatively defined corresponding calibration parameters. The echo measurement is performed while the line input (cf. Uin in FIG. 1) of the LDD is open. By "open" is meant that the line input is not connected to any load, or, in relevant cases, that the line input is connected to adapter cables, which in their turn are not connected to any load. Such adapter cables are sometime delivered with DSLAMs to enable connection to transmission lines via contacts or equipment which already exists at a site where the DSLAMs are to be installed. Such adapter cables are typically shorter than one meter, and may or may not be connected to the DSLAM at delivery. An open line input may be regarded as that an infinite impedance is applied to the line input, thus the notation "PVinf(inity)".

The LDD is then calibrated in an action 204. The calibration is based on the first parameter vector PVinf and at least a second parameter vector PVref (cf. H0 or Zhyb). The second parameter vector PVref is based on information on echo measurements performed on at least one reference LDD. PVref may be the calibrating parameter H0 or Zhyb, described above, or a corresponding calibration parameter in analogy with the reasoning concerning Hinf above.

Calibrating, in this case, means providing necessary calibration parameters, such that these are accessible for the LDD when needed, e.g. for SELT, when measurements are to be performed and e.g. Zin be estimated based on the result of the measurement and the calibration parameters, c.f. equation (11). The calibration parameters could e.g. be stored in a memory in the LDD, or be uploaded and stored in a management or control node, such as e.g. a Copper Plant Manager, CPM, or Access Performance Manager, APM. The LDD is considered to be calibrated if adequate calibration parameters are made accessible for the LDD. Here, the calibration involves that PVinf and PVref are stored, or arranged to be stored, in a suitable place where they may be easily accessed, e.g. in an external management system, etc. as previously described. There may be more than two calibration parameters involved in the calibration, cf. Hinf, H0 and Zhyb described earlier.

In the simplest case, PVinf is derived from measurements on the LDD, and PVref is a reference vector, which has been previously derived from measurements on one or more reference LDDs (of the same type as the individual LDD from which PVinf is derived). The reference vector may be derived from one or more reference LDDs having e.g. short circuited line input(s), or, line input(s) connected to a known impedance Zref. For a PVref corresponding to H0, the measurement was performed on the reference LDD when the line input of the device was short circuited; and for a PVref corresponding to Zhyb, the measurement was performed with a known impedance Zref connected to the line input of the reference LDD. In principal, one measurement on one reference LDD could suffice for deriving a PVref. However, a mean value of measurements performed on more than one line and/or a set of more than one reference LDD would provide a better value, cf. $\overline{H}_0$ and $\overline{Z}_{hyb}$.

By measuring the one value to which the calibration is most sensitive (as described above) on an individual LDD in question, and using predefined reference values, e.g. $\overline{H}_0$ and $\overline{Z}_{hyb}$, possibly in combination with statistics/statistic properties, e.g. $\overline{H}_\infty$, $\mathrm{cov}(H_0\ H_\infty)$, $\sigma_{H_\infty}$ and/or $\rho_{H_0\ H_\infty}$, $\sigma_{H_0}$ and $\sigma_{H_\infty}$, for the remaining calibration parameters, an individualized calibration of the LDD can be achieved at a reasonable time and effort. It has been realized by the inventors that the value to which the calibration is most sensitive is the value of the calibration parameter which corresponds to a very large or infinite impedance on the line input. It has further been realized and shown by the inventors that by measuring this value for an individual LDD having an open line input, a significant improvement of the calibration may be achieved, as compared to using only predefined reference values. Further, the individualized calibration is possible to perform within the time (and cost) limits typically set by the operator of the communication network, as opposed to deriving all calibration parameters by performing measurements on each individual LDD.

Figure 3:
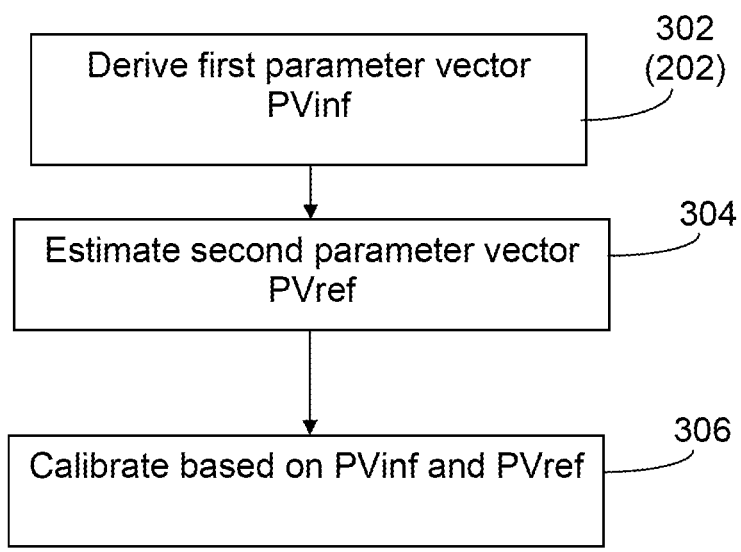

Exemplifying Procedure, FIG. 3

As an alternative to using e.g. "only" a mean value derived from reference LDDs as PVref, said mean value could be refined and adjusted for the individual LDD. For example, the second parameter vector PVref could be estimated in an action 304, based on information on echo measurements performed on a set of reference LDDs, and, further based on the first parameter vector PVinf, and thus be refined. This could be achieved by using statistics/statistical properties, which have been previously derived from measurements on the reference LDDs. The statistics/statistical properties should relate to a relation, dependence or correlation between echo characteristics of the set of reference LDDs when having an open line input, and echo characteristics of the set of reference LDDs when having the line input connected to a known load. By known load is here meant either a short circuit or a known reference impedance Zref. The statistics provide an estimate of the relation between the calibration parameter PVinf (cf. Hinf) and a calibration parameter PVref (cf. H0 or Zhyb) for the type of LDD in question. Thus, when having derived PVinf for an individual LDD, an individual value for PVref could be derived from the statistics/statistical properties, as previously described [refer to section and figure which describes this]. The relation between the parameter vectors could alternatively be derived deterministically based on formulated expressions for the relation (e.g. equation (5)) and having appropriate input values. This is however anticipated to be more computationally complex and to provide an inferior result as compared to the statistical approach. Further, the deterministic relation is mostly not known.

The measurements on reference LDDs referred to in the above examples are assumed to be performed at a site, which is different from the site where the LDD is to be located during operation in a communication system. The reference LDDs may be e.g. a small batch out of a large series of LDDs. These measurements on reference type specimens could e.g. be performed in a factory, or similar, where the LDDs are manufactured.

The measurement on an individual LDD, from which PVinf is to be derived, may in principal be performed at the same site as the measurements on reference LDDs are performed, which site is different from the site where the LDD is to be located during operation. However, in a preferred embodiment, the measurement on the individual LDD is performed at the site where the LDD is to be located during operation, e.g. the central office or the cabinet where the equipment is to be connected to subscriber lines. If the measurement is performed at the site of operation, the calibration will be performed under realistic circumstances, such as the right temperature, humidity, etc., and thus be adapted to adequate real conditions, as previously described. For example, the measurement for deriving PVinf could be performed on the individual LDD during device installation, before connecting the LDD to the lines. The suggested procedure could be performed for a large number of LDDs in parallel, if many LDDs are to be installed at the same site.

The deriving of calibration parameters and the calibration may be triggered by running an initialization/calibration script e.g. as a part of an installation procedure. Such a script and/or the predefined calibration information could be stored in the LDD or in a control node such as a CPM or APM, or, at least partly, be downloaded from an external node e.g. via the Internet, or be retrieved from an USB memory. The calibration procedure could be triggered e.g. automatically when a predefined condition, such as the finishing of an operation or a manufacturing test, is fulfilled and/or following a command from a person executing the installation of one or more LDDs, e.g. DSLAMs.

Figure 4:
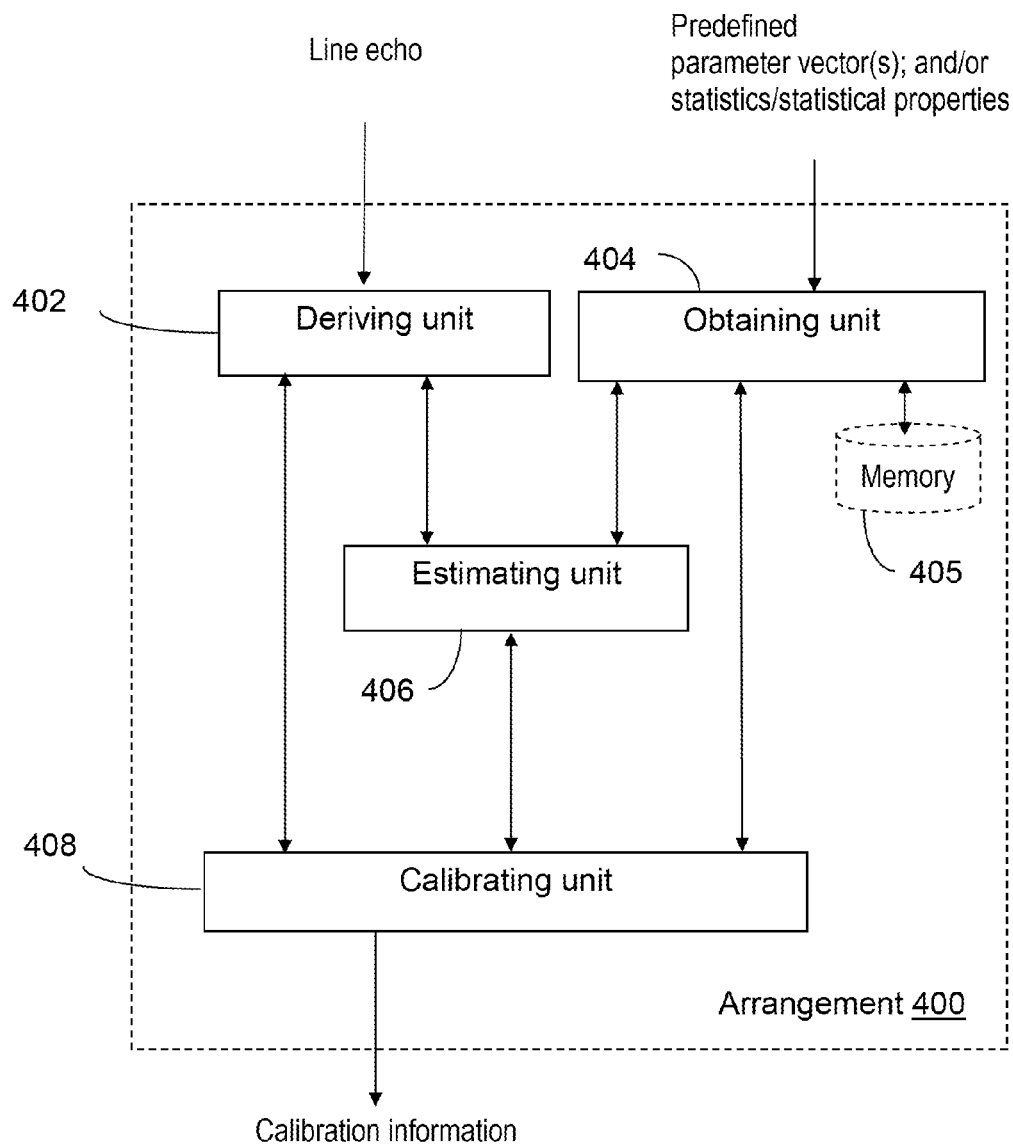
FIGS. 4-7 are block charts illustrating arrangements and nodes according to exemplifying embodiments.

Exemplifying Arrangement, FIG. 4

Below, an exemplifying arrangement in a communication system, for calibration of a LDD will be described with reference to FIG. 4. The LDD is assumed to have a line input. The arrangement may be partly or entirely comprised in the LDD to be calibrated, and/or in a management/control node.

The arrangement 400 comprises a deriving unit 402, which is adapted to derive a first parameter vector PVinf by performing an echo measurement on the LDD while the line input of said LDD is open. The arrangement further comprises a calibration unit 408, which is adapted to calibrate the LDD based on the first parameter vector PVinf and a second parameter vector PVref, which second parameter vector is based on information on echo measurements performed on at least one reference LDD.

The arrangement may further comprise an estimating unit 406, adapted to estimate (and thus refine) the second parameter vector PVref based on statistics/statistical properties on measurements performed on reference LDDs and further based on the first parameter vector PVinf, as previously described. More than one calibration parameter vector PVref could be estimated, cf. H0, $\hat{H}_0$ and Zhyb, $\hat{Z}_{hyb}$. In case the information on echo measurements performed on at least one reference LDD needs to be retrieved from some remote entity or a memory, as described above, the arrangement may comprise an obtaining unit 404, adapted to receive or retrieve the information. The information may comprise e.g. a parameter vector representing echo characteristics of one or more reference LDDs having an open line input and a line input connected to a known load, respectively (c.f. e.g. mean values of Hinf, H0 and Zhyb, i.e. $\overline{H}_\infty$, $\overline{H}_0$ and $\overline{Z}_{hyb}$). The known load may be a short circuit, i.e. approximately no impedance or a known reference impedance Zref. The information may further comprise e.g. statistics indicating a relation or correlation between echo characteristics of a set of reference LDDs having an open line input, and echo characteristics of the set of reference LDDs having the line input connected to a known load.

Figure 5:
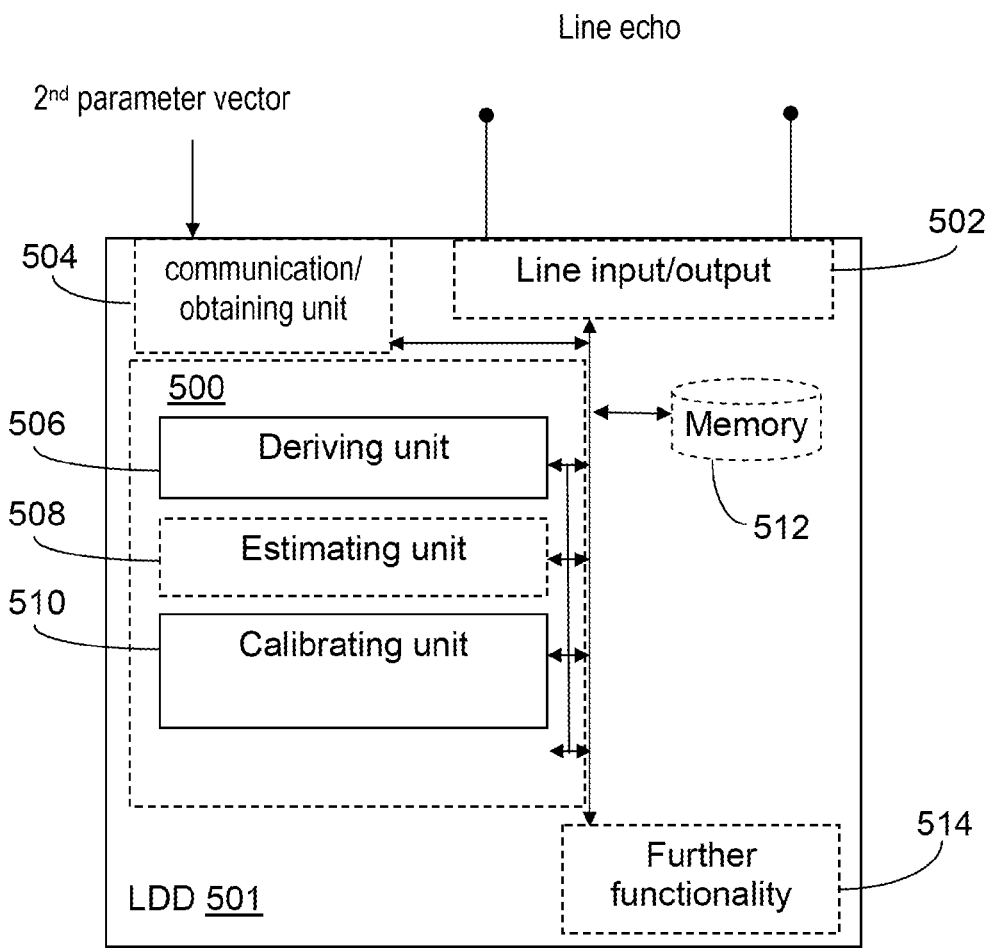
Figure 6:
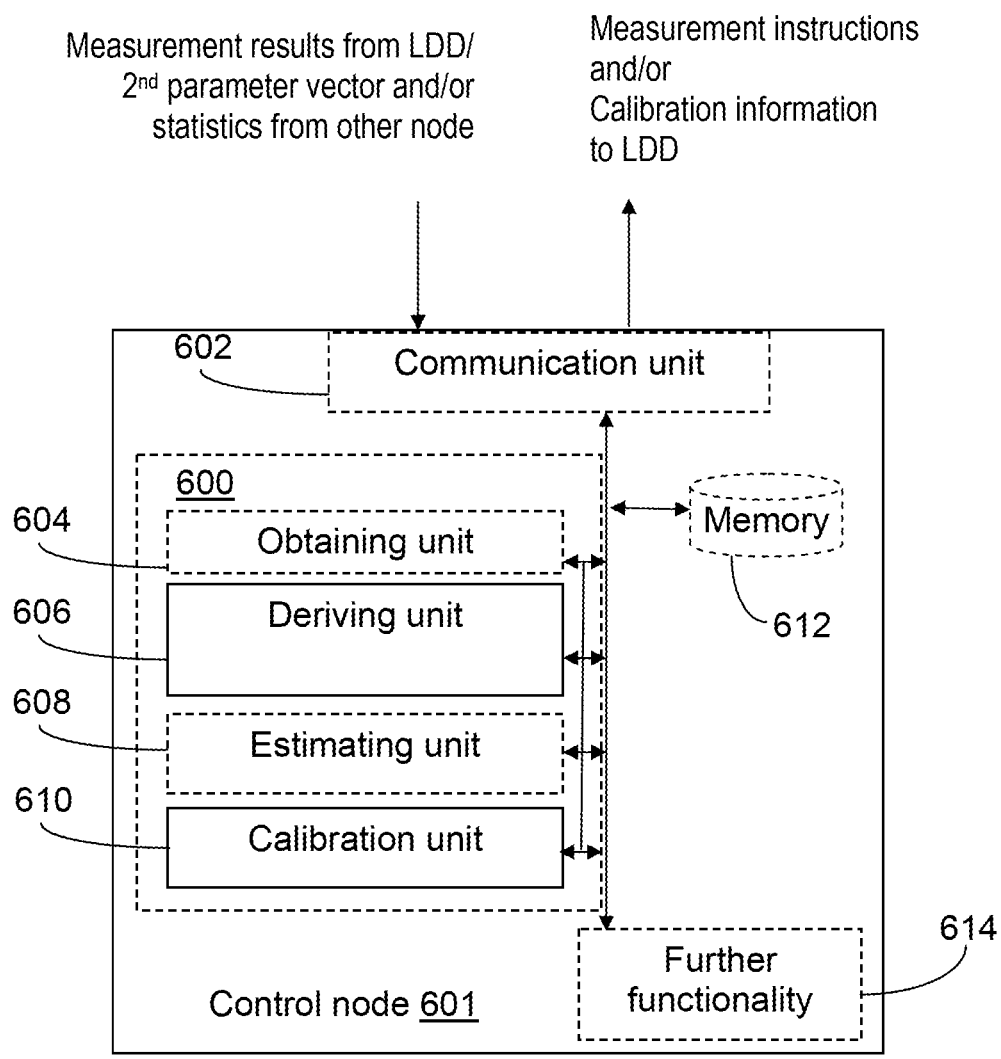

Exemplifying Arrangements/Nodes, FIGS. 5-6

The arrangement 400 may partly or entirely be comprised in an LDD and/or in a control node. This is illustrated in FIGS. 5 and 6. FIG. 5 shows an arrangement 500 comprised in an LDD 501. The arrangement may comprise the same units as previously described in conjunction with FIG. 4. However, in FIG. 5, an obtaining unit 504 has been illustrated as integrated with a communication unit. The LDD 501 further comprises a line input/output 502, and further functionality 514 for providing regular LDD functions.

FIG. 6 illustrates an arrangement 600 comprised in a control node. The control node may be e.g. a CPM or APM, or similar. When the calibration procedure is to be performed from a control node, the measurement on the LDD could be triggered e.g. by transmission of measurement instructions to the LDD. The result of the measurement may then be received from the LDD, e.g. via a communication unit 602. Statistics and results of measurement on reference LDDs may also be received or retrieved via the communication unit, or, such information may have been previously stored e.g. in a memory 612. After the calibration parameters have been derived, the calibration is performed, e.g. by storing of said calibration parameters in memory 614 or the providing of the calibration parameters to the LDD for use and/or storage.

The arrangements and/or nodes/devices described above may be implemented e.g. by one or more of: a processor or a micro processor and adequate software stored in a memory, a Programmable Logic Device (PLD), Field-Programmable Gate Array (FPGA), Application-Specific Integrated Circuit (ASIC) or other electronic component(s) configured to perform the actions mentioned above. The arrangements may be described as comprising processing circuitry configured to perform the relevant actions.

Figure 7:
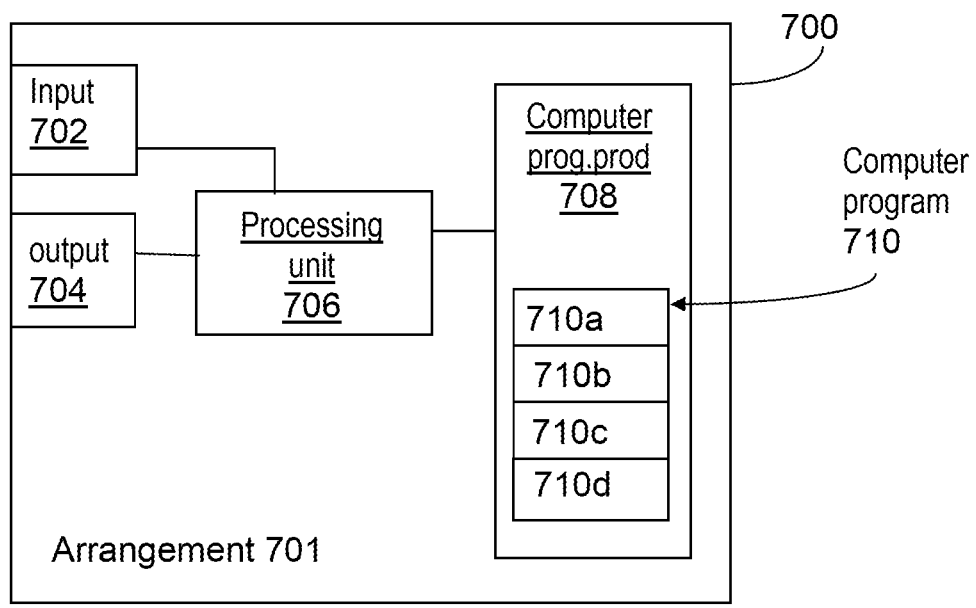

FIG. 7 schematically shows a possible embodiment of an arrangement 700, which also can be an alternative way of disclosing an embodiment of the arrangement illustrated in any of FIGS. 4-6. Comprised in the arrangement 700 are here a processing unit 706, e.g. with a DSP (Digital Signal Processor). The processing unit 706 may be a single unit or a plurality of units to perform different actions of procedures described herein. The arrangement 700 may also comprise an input unit 702 for receiving signals from other entities, and an output unit 704 for providing signal(s) to other entities. The input unit 702 and the output unit 704 may be arranged as an integrated entity.

Furthermore, the arrangement 700 comprises at least one computer program product 708 in the form of a non-volatile memory, e.g. an EEPROM (Electrically Erasable Programmable Read-Only Memory), a flash memory and a hard drive. The computer program product 708 comprises a computer program 710, which comprises code means, which when executed in the processing unit 706 in the arrangement 700 causes the arrangement and/or a node in which the arrangement is comprised to perform the actions e.g. of the procedure described earlier in conjunction with FIGS. 2 and 3.

The computer program 710 may be configured as a computer program code structured in computer program modules. Hence, in an exemplifying embodiment, the code means in the computer program 710 of the arrangement 700 may comprise an obtaining module 710a for obtaining e.g. of information on measurements on reference LDDs. The arrangement 700 comprises a deriving or measurement module 710b for deriving of calibration parameters. The computer program may further comprise an estimation module 710c for estimating one or more calibration parameter vectors. The computer program 710 further comprises a calibration module 710d for calibration of an individual LDD.

The modules 710a-d could essentially perform the actions of the flows illustrated in FIGS. 2 and 3, to emulate the arrangement illustrated in any of FIGS. 4-6.

Although the code means in the embodiment disclosed above in conjunction with FIG. 7 are implemented as computer program modules which when executed in the processing unit causes the decoder to perform the actions described above in the conjunction with figures mentioned above, at least one of the code means may in alternative embodiments be implemented at least partly as hardware circuits.

The processor may be a single CPU (Central processing unit), but could also comprise two or more processing units. For example, the processor may include general purpose microprocessors; instruction set processors and/or related chips sets and/or special purpose microprocessors such as ASICs (Application Specific Integrated Circuit). The processor may also comprise board memory for caching purposes. The computer program may be carried by a computer program product connected to the processor. The computer program product may comprise a computer readable medium on which the computer program is stored. For example, the computer program product may be a flash memory, a RAM (Random-access memory) ROM (Read-Only Memory) or an EEPROM, and the computer program modules described above could in alternative embodiments be distributed on different computer program products in the form of memories within the network node.

It is to be understood that the choice of interacting units or modules, as well as the naming of the units are only for exemplifying purpose, and nodes suitable to execute any of the methods described above may be configured in a plurality of alternative ways in order to be able to execute the suggested process actions.

It should also be noted that the units or modules described in this disclosure are to be regarded as logical entities and not with necessity as separate physical entities.

Although the description above contains many specificities, these should not be construed as limiting the scope of the invention but as merely providing illustrations of some of the presently preferred embodiments of this invention. It will be appreciated that the scope of the present invention fully encompasses other embodiments which may become obvious to those skilled in the art, and that the scope of the present invention is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the present invention, for it to be encompassed hereby.

The invention claimed is:

1. A method for calibration of a line driving device having a line port, the method comprising:
   deriving a first parameter vector (PVinf) by performing, at a first site, an echo measurement on the line driving device while the line port on said line driving device is an open-circuit;
   calibrating the line driving device based on the first parameter vector and a second parameter vector (PVref), which second parameter vector is based on information on echo measurements performed on at least one reference line driving device.

2. The method according to claim 1, further comprising:
   estimating the second parameter vector (PVref) further based on the first parameter vector (PVinf).

3. The method according to claim 1, wherein the information relates to at least one of:
   a parameter vector representing echo characteristics of a reference line driving device having the line port connected to a known load;
   a mean value of parameter vectors representing echo characteristics of a set of reference line driving devices having the line port connected to a known load;
   a mean value of parameter vectors representing echo characteristics of a set of reference line driving devices having an open-circuit line port; and
   a relation between echo characteristics of a set of reference line driving devices having an open-circuit line port, and echo characteristics of the set of reference line driving devices having the line port connected to a known load.

4. The method according to claim 3, wherein the known load is one of:
   a short circuit;
   a reference impedance (Zref).

5. The method according to claim 1, wherein the information is obtained from a control node in a communication system in which the line driving device is to operate.

6. The method according to claim 1, wherein said first site is a site where the line driving device is to be located during operation in a communication system.

7. The method according to claim 6, wherein the method is performed during device installation.

8. The method according to claim 1, wherein said first site is a site where the line driving device is manufactured.

9. The method according to claim 1, wherein the second parameter vector (PVref) is based on information on measurements which are performed at a second site, which is different from the first site.

10. An arrangement in a communication system, for calibration of a line driving device having a line port, the arrangement comprising:
    at least one microprocessor; and
    a non-transitory computer-readable storage medium, coupled to said at least one microprocessor, wherein said non-transitory computer-readable storage medium further includes computer-readable instructions, when executed by said at least one microprocessor, are configured to:

derive a first parameter vector (PVinf) by performing an echo measurement on the line driving device while the line port on said line driving device is an open-circuit, and calibrate the line driving device based on the first parameter vector and a second parameter vector (PVref), which second parameter vector is based on information on echo measurements performed on at least one reference line driving device.

11. The arrangement according to claim 10, wherein said computer-readable instructions, when executed by said at least one microprocessor, are further configured to:

estimate the second parameter vector (PVref) further based on the first parameter vector (PVinf).

12. The arrangement according to claim 10, wherein the information relates to at least one of:

a parameter vector representing echo characteristics of a reference line driving device having the line port connected to a known load;

a mean value of parameter vectors representing echo characteristics of a set of reference line driving devices having the line port connected to a known load;

a mean value of parameter vectors representing echo characteristics of a set of reference line driving devices having an open line port; and a relation between echo characteristics of a set of reference line driving devices having an open-circuit line port, and echo characteristics of the set of reference line driving devices having the line port connected to a known load.

13. The arrangement according to claim 12, wherein the known load is one of:

a short circuit;

a reference impedance (Zref).

14. The arrangement according to claim 10, further comprising computer-readable instructions, when executed by said at least one microprocessor, are configured to:

obtain said information from a control node in a communication system in which the line driving device is to operate.

15. Line driving device comprising an arrangement according to claim 10.

16. Digital Subscriber Line Access Multiplexer comprising an arrangement according to claim 10.

17. A non-transitory computer-readable storage medium, further including computer-readable instructions, when executed by at least one microprocessor, are configured to:

derive a first parameter vector (PVinf) by performing an echo measurement on the line driving device while the line port on said line driving device is an open-circuit, and calibrate the line driving device based on the first parameter vector and a second parameter vector (PVref), which second parameter vector is based on information on echo measurements performed on at least one reference line driving device.

18. The non-transitory computer-readable storage medium according to claim 17, wherein the computer-readable instructions, when executed by the at least one microprocessor, are further configured to:

estimate the second parameter vector (PVref) further based on the first parameter vector (PVinf).

19. The non-transitory computer-readable storage medium according to claim 17, wherein the information relates to at least one of:

a parameter vector representing echo characteristics of a reference line driving device having the line port connected to a known load;

a mean value of parameter vectors representing echo characteristics of a set of reference line driving devices having the line port connected to a known load;

a mean value of parameter vectors representing echo characteristics of a set of reference line driving devices having an open line port; and a relation between echo characteristics of a set of reference line driving devices having an open-circuit line port, and echo characteristics of the set of reference line driving devices having the line port connected to a known load.

20. The non-transitory computer-readable storage medium according to claim 17, wherein the known load is one of:

a short circuit;

a reference impedance (Zref).

\* \* \* \* \*